US006633048B2

(12) United States Patent
Orsini

(10) Patent No.: US 6,633,048 B2
(45) Date of Patent: Oct. 14, 2003

(54) HIGH OUTPUT EXTREME ULTRAVIOLET SOURCE

(75) Inventor: Rocco A. Orsini, Long Beach, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 154 days.

(21) Appl. No.: 09/848,692

(22) Filed: May 3, 2001

(65) Prior Publication Data

US 2002/0162975 A1 Nov. 7, 2002

(51) Int. Cl.$^7$ ................................................ G21G 4/00
(52) U.S. Cl. ................... 250/493.1; 250/492.1; 378/119
(58) Field of Search ........................ 250/492.1, 493.1; 378/119

(56) References Cited

U.S. PATENT DOCUMENTS

| 5,577,092 A | 11/1996 | Kublak et al. |
| 6,007,963 A | 12/1999 | Felter et al. |
| 6,285,455 B1 * | 9/2001 | Shiraishi ..................... 356/486 |

* cited by examiner

Primary Examiner—John R. Lee
Assistant Examiner—Paul M. Gurzo
(74) Attorney, Agent, or Firm—John A. Miller, Esq.; Warn, Burgess & Hoffmann, P.C.

(57) ABSTRACT

An EUV source (82) that delivers a laser beam (94, 96) asymmetrical relative to first collection optics (88). The first collection optics (88) has an opening (90, 92) for the laser beam (94, 96) that is positioned so that the laser beam (94, 96) is directed towards the plasma off-axis relative to the collection optics (88). Thus, the strongest EUV radiation (98, 100) is not blocked by the target production hardware (84).

13 Claims, 2 Drawing Sheets

HIGH OUTPUT EXTREME ULTRAVIOLET SOURCE

BACKGROUND OF THE INVENTION

1. Field of the Invention

This invention relates generally to an extreme ultraviolet (EUV) lithography source and, more particularly, to an EUV source that employs an input laser beam positioned off-axis or asymmetrically relative to the first collection optics to improve the fraction of produced EUV radiation.

2. Discussion of the Related Art

Microelectronic integrated circuits are typically patterned on a substrate by a photolithography process that is well known to those skilled in the art, where the circuit elements are defined by a light beam propagating through a mask. As the state of the art of the photolithography process and integrated circuit architecture becomes more developed, the circuit elements become smaller and more closely spaced together. As the circuit elements become smaller, it is necessary to employ photolithography light sources that generate light beams having shorter wavelengths and higher frequencies. In other words, the resolution of the photolithography process increases as the wavelength of the light source decreases to allow smaller integrated circuit elements to be defined. The current trend for photolithography light sources is to develop a system that generates light in the extreme ultraviolet (EUV) or soft X-ray wavelengths (13.4 nm).

Different devices are known in the art to generate EUV radiation. One of the most popular EUV radiation sources is a laser-plasma, gas condensation source that uses a gas, typically Xenon, as a laser plasma target material. Other gases, such as Krypton, and combinations of gases, are also known for the laser target material. The gas is forced through a nozzle, and as the gas expands, it condenses and converts to a liquid spray. The liquid spray is illuminated by a high-power laser beam, typically from an Nd:YAG laser, that heats the liquid droplets to produce a high temperature plasma which radiates the EUV radiation. U.S. Pat. No. 5,577,092 issued to KUBIAK discloses an EUV radiation source of this type.

FIG. 1 is a plan view of a known EUV radiation source 10 including a nozzle 12 and a laser beam source 14. A gas 16 flows through a neck portion 18 of the nozzle 12 from a gas source (not shown). The gas is accelerated through a narrowed throat portion and is expelled through an exit collimator of the nozzle 12 as a jet spray 26 of liquid droplets. A laser beam 30 from the source 14 is focused by focusing optics 32 on the liquid droplets. The heat from the laser beam 30 generates a plasma 34 that radiates EUV radiation 36. The nozzle 12 is designed so that it will stand up to the heat and rigors of the plasma generation process. The EUV radiation 36 is collected by collection optics 38 and is directed to the circuit (not shown) being patterned. The collection optics 38 can have any suitable shape for the purposes of collecting and directing the radiation 36. In this design, the laser beam 30 propagates through an opening 40 in the collection optics 38.

It has been shown to be difficult to produce a spray having large enough droplets of liquid to achieve the desired efficiency of conversion of the laser radiation to the EUV radiation. Because the liquid droplets have too small a diameter, and thus not enough mass, the laser beam 30 causes some of the droplets to break-up before they are heated to a sufficient enough temperature to generate the EUV radiation 36. Typical diameters of droplets generated by a gas condensation EUV source is on the order of 0.33 microns. However, droplet sizes of about 1 micron in diameter would be desirable for generating the EUV radiation. Additionally, the large degree of expansion required to maximize the condensation process produces a diffuse jet of liquid, and is inconsistent with the optical requirement of a small plasma size.

To overcome the problem of having sufficiently large enough liquid droplets as the plasma target, U.S. patent application Ser. No. (Attorney Docket No. 11-1119), filed Aug. 23, 2000, titled "Liquid Sprays as the Target for a Laser-Plasma Extreme Ultraviolet Light Source," discloses a laser-plasma, extreme ultraviolet light source for a photolithography system that employs a liquid spray as a target material for generating the laser plasma. In this design, the EUV source forces a liquid, preferably Xenon, through the nozzle, instead of forcing a gas through the nozzle. The geometry of the nozzle and the pressure of the liquid propagating through the nozzle atomizes the liquid to form a dense spray of liquid droplets. Because the droplets are formed from a liquid, they are larger in size, and are more conducive to generating the EUV radiation.

Sources for EUV lithography based on laser produced plasma currently employ laser beams that are symmetric with the axis of the first collection optics. Hardware, including the nozzle, diffuser, etc., that provides the target material for the laser beam is positioned proximate the focal point of the first collection optics because the plasma generation area must be located at this position. The nozzle is positioned orthogonal to the laser beam. In this position, the hardware obscures the EUV radiation reflected from the central portion of the optics. This is because the EUV radiation generated from the plasma has an angular distribution that is strongly peaked in the direction of the incoming laser beam and decreases to nearly zero at angles orthogonal to the laser beam. Hence, the region of the strongest EUV illumination at the collection optics cannot reflect to subsequent optics, resulting in a substantial decrease in the fraction of EUV radiation that can be utilized.

FIG. 2 is a schematic plan view of a known EUV radiation source 50 from a different angle than the source 10 shown in FIG. 1 that demonstrates this problem. In this example, a nozzle and associated target production hardware 52 is shown positioned relative to a plasma spot 54. The target laser beam 56 propagates through an opening 58 in collection optics 60, where the axis of the laser beam is symmetric relative to the shape of the optics 60. The collection optic 60 is generally dish-shaped having a reflective surface shape suitable for the purposes described herein. In this configuration, the angular distribution 62 of the produced EUV radiation causes the strongest EUV radiation to propagate towards the collection optics 60 in a direction directly opposite to propagation direction of the laser beam 56. Thus, the stronger EUV radiation reflected from the optics 60 is directed back towards the target production hardware 52 and the weaker EUV radiation is reflected at the edges of the collection optics 60. Thus, the target production hardware 52 blocks much of the strong EUV radiation, which results in a significant loss of this radiation.

What is needed is a design change of the known EUV source that does not obscure a significant portion of the generated EUV radiation so as to increase the fraction of EUV radiation that is usable. It is therefore an object of the present invention to provide such a source.

SUMMARY OF THE INVENTION

In accordance with the teachings of the present invention, an EUV source is disclosed that delivers the laser beam to the plasma generation area off-axis relative to the first collection optics. Particularly, the first collection optics has an opening for the laser beam at a location so that laser beam is directed towards the plasma generation area at an angle that is off-axis relative to the collection optics. Thus, the strongest EUV radiation is not blocked by the target production hardware. In one embodiment, the collection optics is a section of a dish, where the direction of the laser beam causes the strongest EUV radiation to be reflected from the outer edges of the optics. In another embodiment, the collection optics is a full dish having two openings for two separate laser beams to generate EUV radiation sent in a direction so it is also reflected at the outer edges of the optics.

Additional objects, advantages and features of the present invention will become apparent to those skilled in the art from the following discussion and the accompanying drawings and claims.

DETAILED DESCRIPTION OF THE PREFERRED EMBODIMENTS

The following discussion of the preferred embodiments directed to an EUV lithography source where an input laser beam is delivered off-axis relative to the first collection optics is merely exemplary in nature, and is in no way intended to limit the invention or its applications or uses.

Figure 1:
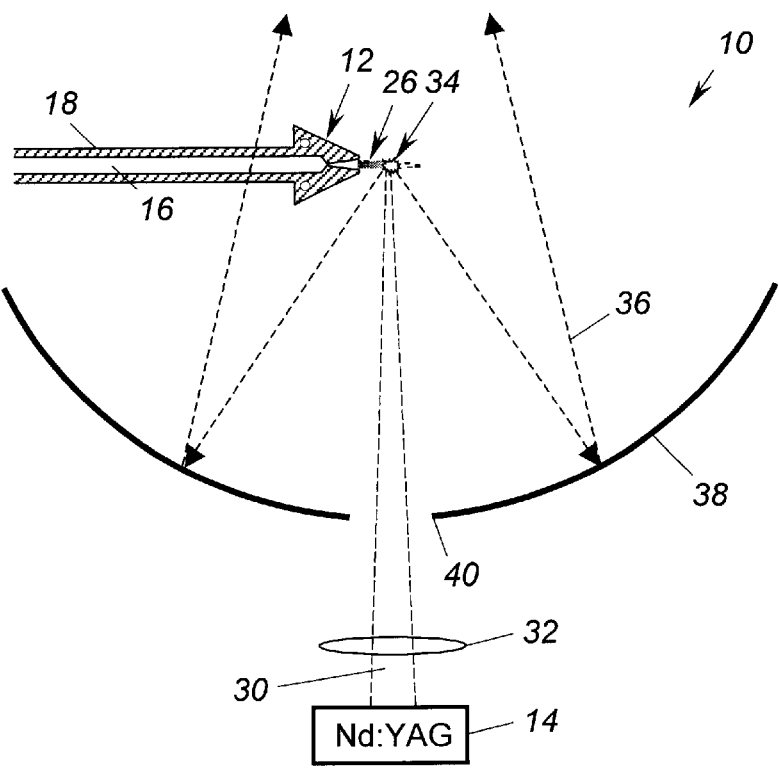
FIG. 1 is a plan view of a known laser-plasma, gas condensation extreme ultraviolet light source.
Figure 2:
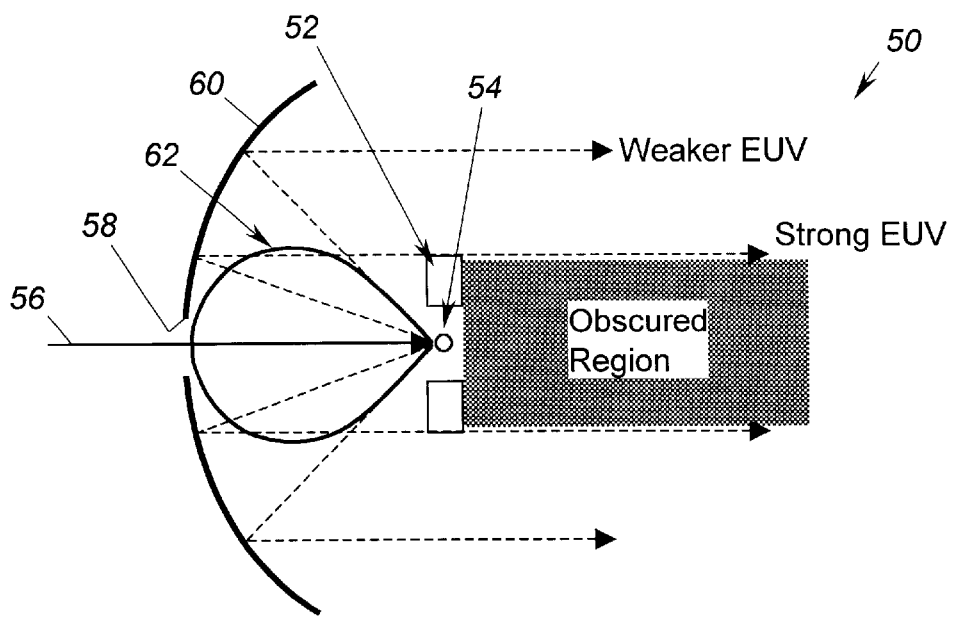
FIG. 2 is a schematic plan view of a known EUV source where the input laser beam is symmetric relative to the first collection optics.
Figure 3:
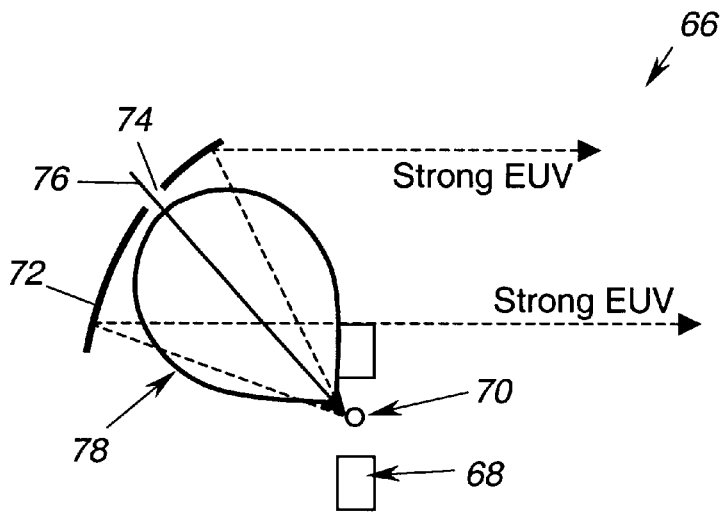
FIG. 3 is a schematic plan view of an EUV source where a single input laser beam is provided off-axis relative to the first collection optics, according to an embodiment of the present invention.

FIG. 3 is a plan view of an EUV source 66 shown at an angle similar to that of the source 50 shown in FIG. 2, according to an embodiment of the present invention. In this embodiment, target production hardware 68 is positioned at its usual location relative to a plasma spot 70. However, the collection optics 60 had been replaced with first collection optics 72 that is only partially dish-shaped and is positioned at a different location relative to the hardware 68 than the collection optics 60. In this embodiment, the collection optics 72 is about half the size of the collection optics 60, and is positioned above the target hardware 68. An opening 74 is provided in the collection optics 72 through which a target laser beam 76 propagates to the plasma spot 70. The input laser beam 76 is positioned off-axis or asymmetrical relative to the collection optics 72. Because the collection optics 72 is at this position, the angular distribution 78 of the generated EUV radiation directed towards the collection optics 72 is such that the strong EUV radiation is reflected from the upper edges of the optics 72 and is not obscured by the target hardware 68, as shown.

Figure 4:
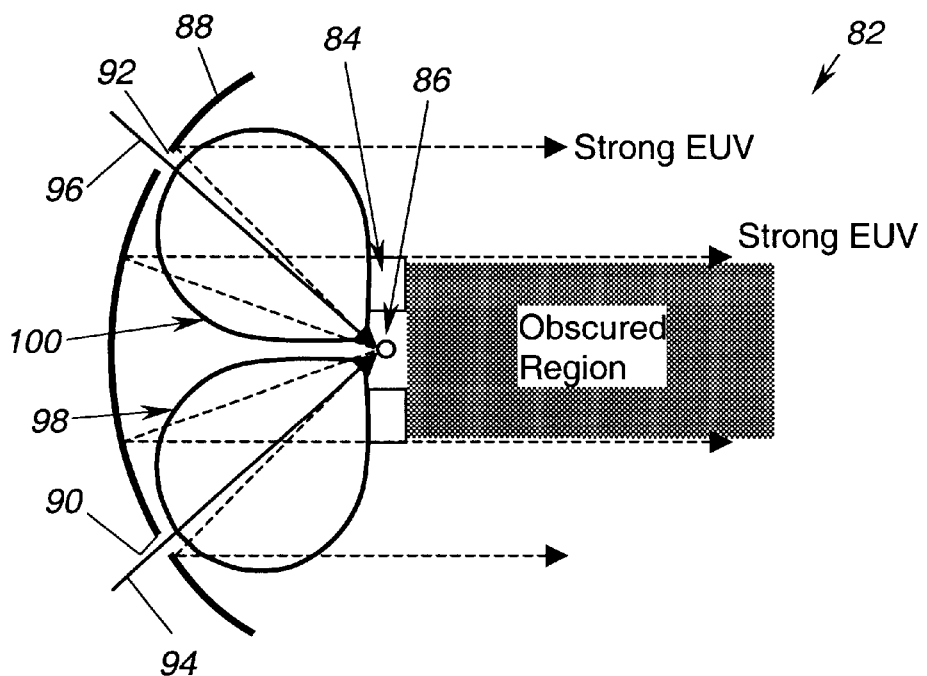
FIG. 4 is a schematic plan view of an EUV source where two input laser beams are provided off-axis relative to the first collection optics, according to another embodiment of the present invention.

In the embodiment shown in FIG. 3, the collection optics 72 is about one-half the size of the collection optics 60 shown in FIG. 2. Therefore, some of the generated EUV radiation does not get reflected from the collection optics 72 that normally would in the conventional system. FIG. 4 is a schematic plan view of an EUV source 82 including target hardware 84 and a plasma spot 86, according to another embodiment of the present invention. In this embodiment, first collection optics 88 has the same shape as the collection optics 60, but includes two openings 90 and 92 for two separate input laser beams 94 and 96, respectively. Basically, it is the embodiment shown in FIG. 3, only doubled so that strong EUV radiation is provided both above and below the target hardware 84. Particularly, the angular distribution 98 of the EUV radiation from the beam 94 is directed along the line of the input laser beam 94 and is reflected from the optics 88 below the target hardware 84, and the angular distribution 100 of the EUV radiation from the beam 96 is directed along the line of the input laser beam 96 and is reflected above the target hardware 84. Therefore, the embodiment shown in FIG. 4 provides more EUV radiation than the EUV source 50.

The foregoing discussion describes merely exemplary embodiments of the present invention. One skilled in the art would readily recognize that various changes, modifications and variations can be made therein without departing from the spirit and scope of the invention as defined in the following claims.

What is claimed is:

1. A laser-plasma extreme ultraviolet (EUV) radiation source comprising:
a nozzle emitting a spray of target material into a plasma generation region; and
collection optics positioned relative to the plasma generation region, said collection optics including at least one opening through which a laser beam propagates to impinge the target material and generate a plasma, said opening being positioned at a location asymmetrical relative to the collection optics so that the laser beam is directed off-axis relative to the collection optics and most of the strongest EUV radiation from the plasma reflected by the collection optics is not obscured by the nozzle.

2. The source according to claim 1 wherein the collection optics is dish-shaped.

3. The source according to claim 1 wherein the collection optics is a portion of a dish shape.

4. The source according to claim 1 wherein the collection optics includes two separate openings, each receiving a separate laser beam.

5. A laser-plasma extreme ultraviolet (EUV) radiation source comprising:
a nozzle emitting a spray of target material into a plasma generation region; and
collection optics positioned relative to the nozzle, said collection optics including at least one opening through which a laser beam propagates to impinge the target material and generate a plasma, said opening being positioned at a location asymmetrical relative to the collection optics so that the laser beam is directed off-axis relative to the collection optics and most of the strongest EUV radiation from the plasma reflected by the collection optics is not obscured by the nozzle but is disposed such that the angular distribution of the generated EUV radiation causes most of the strongest EUV radiation to be directed towards an edge of the collection optics.

6. A laser-plasma extreme ultraviolet (EUV) radiation source comprising:
a nozzle emitting a spray of target material into a plasma generation region; and collection optics positioned relative to the plasma generation region, said collection optics including a single opening through which a single laser beam propagates to impinge the target material and generate a plasma, said opening being positioned at a location asymmetrical relative to the collection optics so that the laser beam is directed off-axis relative to the collection optics and most of the strongest EUV radiation from the plasma reflected by the collection optics is not obscured by the nozzle.

7. A laser-plasma extreme ultraviolet (EUV) radiation source for generating EUV radiation, said source comprising:

target production hardware including a nozzle, said nozzle emitting a spray of target material into a plasma generation region;

a laser beam source, said laser beam source generating a laser beam directed towards the plasma generation region; and collection optics positioned between the laser beam source and the target production hardware, said collection optics including at least one opening through which the laser beam propagates to impinge the target material and generate a plasma, said collection optics having a shape that is at least a portion of a dish, said plasma generation region being at a focal point of the collection optics and said target production hardware being proximate the focal point of the collection optics, said opening being positioned at a location asymmetrical relative to the shape of the collection optics so that the laser beam is directed off-axis relative to the collection optics and most of the strongest EUV radiation from the plasma reflected by the collection optics is not obscured by the target production hardware.

8. A laser-plasma extreme ultraviolet (EUV) radiation source for generating EUV radiation, said source comprising:

target production hardware including a nozzle, said nozzle emitting a spray of target material into a plasma generation region;

a laser beam source, said laser beam source generating a laser beam directed towards the plasma generation region; and collection optics positioned between the laser beam source and the target production hardware, said collection optics including at least one opening through which the laser beam propagates to impinge the target material and generate a plasma, said collection optics having a shape that is at least a portion of a dish, said plasma generation region being at a focal point of the collection optics and said target production hardware being proximate the focal point of the collection optics, said opening being positioned at a location asymmetrical relative to the shape of the collection optics so that the laser beam is directed off-axis relative to the collection optics and most of the strongest EUV radiation from the plasma reflected by the collection optics is not obscured by the target production hardware and wherein the collection optics is positioned relative to the nozzle such that the angular distribution of the generated EUV radiation causes most of the strongest EUV radiation to be directed towards an edge of the collection optics.

9. The source according to claim 8 wherein the collection optics is dish-shaped.

10. The source according to claim 8 wherein the collection optics includes two separate openings, each receiving a separate laser beam.

11. A method of generating extreme ultraviolet (EUV) radiation, said method comprising the steps of:

providing target production hardware including a nozzle;

emitting a spray of target material from the nozzle into a plasma generation region;

directing at least one laser beam to the plasma generation region to heat the target material and generate the EUV radiation; and reflecting the generated EUV radiation from collection optics, said step of directing the laser beam including directing the laser beam through an opening in the collection optics so that the laser beam is off-axis relative to the collection optics and most of the strongest EUV radiation is not obscured by the target production hardware.

12. The method according to claim 11 wherein the step of directing the laser beam includes directing two separate laser beams through two separate holes in the collection optics, where both laser beams are off-axis relative to the collection optics.

13. A method of generating extreme ultraviolet (EUV) radiation, said method comprising the steps of:

providing target production hardware including a nozzle;

emitting a spray of target material from the nozzle into a plasma generation region;

directing at least one laser beam to the plasma generation region to heat the target material and generate the EUV radiation; and reflecting the generated EUV radiation from collection optics, said step of directing the laser beam including directing the laser beam through an opening in the collection optics so that the laser beam is off-axis relative to the collection optics and most of the strongest EUV radiation is not obscured by the target production hardware and is reflected from an edge of the collection optics.

\* \* \* \* \*